(12) United States Patent
Scalf et al.

(10) Patent No.: US 6,925,710 B1
(45) Date of Patent: Aug. 9, 2005

(54) METHOD FOR MANUFACTURING MICROELECTROMECHANICAL COMBDRIVE DEVICE

(75) Inventors: Jennifer Scalf, Pasadena, CA (US); Satinderpal Pannu, Berkeley, CA (US)

(73) Assignee: Analog Devices, Inc., Norwood, MA (US)

( * ) Notice: Subject to any disclaimer, the term of this patent is extended or adjusted under 35 U.S.C. 154(b) by 257 days.

(21) Appl. No.: 10/112,063

(22) Filed: Mar. 27, 2002

(51) Int. Cl.[7] .............................................. H05K 3/02
(52) U.S. Cl. ............................. 29/847; 29/846; 29/830; 310/309; 359/254
(58) Field of Search ....................... 29/847, 830, 846, 29/851, 595, 593, 603.13; 310/309; 359/254; 250/306, 442.11; 369/126; 361/283.3; 73/514.01, 73/514.32; 438/459

(56) References Cited

U.S. PATENT DOCUMENTS

| | | | |
|---|---|---|---|
| 5,025,346 A | 6/1991 | Tang et al. ................. 361/283 |
| 5,314,572 A | 5/1994 | Core et al. .................. 156/643 |
| 5,648,618 A | 7/1997 | Neukermans et al. .... 73/862.08 |
| 5,723,353 A | 3/1998 | Muenzel et al. .............. 437/51 |
| 5,726,073 A | 3/1998 | Zhang et al. ................ 437/228 |
| 5,753,911 A | 5/1998 | Yasuda et al. ............... 250/306 |
| 5,872,880 A | 2/1999 | Maynard ...................... 385/88 |
| 5,881,198 A | 3/1999 | Haake ......................... 385/136 |
| 5,959,760 A | 9/1999 | Yamada et al. ............. 359/224 |
| 5,969,848 A | 10/1999 | Lee et al. .................... 359/298 |
| 5,995,334 A | 11/1999 | Fan et al. .................... 360/106 |
| 5,998,906 A | 12/1999 | Jerman et al. .............. 310/309 |
| 6,000,280 A * | 12/1999 | Miller et al. ................... 73/105 |
| 6,330,102 B1 | 12/2001 | Daneman et al. ........... 359/290 |
| 6,384,510 B1 * | 5/2002 | Grade et al. ................. 310/309 |
| 6,612,029 B2 * | 9/2003 | Behin et al. ................... 29/847 |
| 2001/0034938 A1 | 11/2001 | Behin et al. |
| 2001/0040419 A1 | 11/2001 | Behin et al. |
| 2001/0048784 A1 | 12/2001 | Behin et al. |
| 2001/0050801 A1 | 12/2001 | Behin et al. |

(Continued)

FOREIGN PATENT DOCUMENTS

DE 296118818 12/1996 ............ G02B 6/35

(Continued)

OTHER PUBLICATIONS

A Low Voltage, Large Scan Angle MEMS Micromirror with Hidden Vertical Comb-Drive Actuators for WDM Routers, Dooyoung Hah, et al., paper presented at Optical Fiber Conference, Mar. 19, 2002, Anaheim, CA.

(Continued)

*Primary Examiner*—Minh Trinh
(74) *Attorney, Agent, or Firm*—JDI Patent; Joshua D. Isenberg

(57) ABSTRACT

Methods of making microelectromechanical combdrive devices are disclosed. The device may optionally be formed using three device layers. A moveable element and flexure may be formed from a first device layer. The second device layer may be attached to the first and a first set of comb teeth are formed from the second device layer. One or more comb teeth in the first set extend from a major surface of the moveable element. A third device layer is attached to the second device layer and a second set of comb teeth are formed from the third device layer. An alignment target is formed in the first device layer. Corresponding alignment holes are formed in the second or third device layers.

26 Claims, 4 Drawing Sheets

U.S. PATENT DOCUMENTS

| | | | |
|---|---|---|---|
| 2001/0051014 A1 | 12/2001 | Behin et al. | |
| 2002/0005976 A1 | 1/2002 | Behin et al. | |
| 2002/0026831 A1 | 3/2002 | Behin et al. | |

FOREIGN PATENT DOCUMENTS

| | | | | |
|---|---|---|---|---|
| DE | 19757181 A | 7/1997 | ............ | G02B 6/35 |
| DE | 19644918 A | 4/1998 | ............ | G02B 6/35 |
| EP | 0907076 A2 | 4/1999 | .......... | G01N 27/00 |
| EP | 0911952 A2 | 4/1999 | ............ | H02N 1/00 |
| EP | 0911952 A3 | 4/2000 | ............ | H02N 1/00 |
| EP | 0907076 A3 | 10/2000 | ........... | H01J 37/63 |
| FR | 2732467 A1 | 4/1996 | ........... | G01P 15/08 |

OTHER PUBLICATIONS

U.S. Appl. No. 09/584,835 entitled "Staggered Torsional Electrostatic Combdrive and Method of Forming Same" to Robert A. Conant and Jocelyn T. Nee, Kam-Yin Lau and Richard S. Muller, filed May 31, 2000.

"A Flat High-Frequency Scanning Micromirror"; Robert A. Conant, Jocelyn T. Nee, Kam Y. Lau and Richard S. Muller; Berkeley Sensor & Actuator Center, University of California, Berkeley.

Yao, Shimin and McDonald, Noel. "Single crystal silicon supported thin film micromirrors for optical applications," Journal of Optical Engineering, vol. 36(5), May 1997.

Electrostatic Comb Drive For Vertical Actuator A.P. Lee et al., Proceedings of the SPIE, SPIE, Bellingham, VA, vol. 3224, Sep. 29, 1997, pp 109-119.

"Design, Fabrication, Position S nsing, And Control Of An Electrostatically-Driven Polysilicon Microactuator," P. Cheung et al, IEEE Transactions on Magnetics, vol. 32, No. 1, Jan. 1, 1996, pp 122-128.

"Optical Methods For Micromachine Monitoring And Feedback", F.M. Dickey et al., Sensors and Actuators, vol. 78, 1999, pp 220-235.

"A High Sensitivity Z-Axis Capacitive Silicon Microaccelerometer with a Torsional Suspension", Selvakumar et al., Journal of Microelectromechanical Systems, IEEE Inc., New York, vol. 7, No. 2, Jun. 1998, pp 192-200.

"MEMS Fabrication of High Aspect Ratio Track-Following Micro Actuator for Hard Disk Drive Using Silicon On Insulator", B. H. Kim et al., Technical Digest of the IEEE International MEMS '99 Converence. 12th IEEE International Conference on Micro Electro Mechanical Systems. Orlando, FL, Jan. 17-21, 1999, IEEE International Micro Electro Mechanical Systems Converence, New York, NY, 1999, pp 53-56.

"Fabrication of Comb-Shaped Microactuator for Multi-Degrees-of-Freedom System", F. Fujikawa et al., Robotics, CIM and Automation, Emerging Technologies, San Diego, Nov. 9-13, 1992, Proceedings of the International Converence on Industrial Electronics, Control, Instrumentation and Automation (IECON), New York, NY, IEEE, US, vol. 2 Conf 18, Nov. 9, 1992, pp 990-995.

"Integrated Micro-Scanning Tunneling Microscope", Xu et al., Applied Physics Letters, American Institute of Physics, New York, vol. 67, No. 16, Oct. 16, 1995 pp 2305-2307.

"Vertical Comb Array MicroActuators", A. Selvakumar et al., Proceedings of the Workshop on Micro Elecrical Mechanical Systems (MEMS), Amsterdam, New York, Jan. 29-Feb. 2, 1995, IEEE vol. Workshop 8 Jan. 29, 1995, pp 43-48, ISBN 0-7803-2504-4.

"Fabrication of a 3D Differential-Capacitive Acceleration Sensor by UV-LIGA", W. Qu et al., Sensors and Actuators 77 (1999), pp 14-20, Elsevier Science, 0924-4247/99/$.

"Integrating SCREAM Micromachined Devices with Integrated Circuits", K.A. Shaw, N.C MacDonald, IEEE MEMS '96, San Diego, California 1996, IEEE Publication 0-7803-2985-6/96, pp 44-48.

"An electrostatically excited 2D-Micro-Scanning-Mirror with an in-plane configuration of the driving electrodes", H. Schenk et al., MEMS 2000, 13th Int. Micro Electro Mechanical Systems Conf, Miyazaki, Japan, p. 473-478 (2000).

"Damping of Micro Electrostatic Torsion Mirror Caused by Air-Film Viscosity", N. Uchida et al.

"Single Crystal Silicon (SCS) MicroMirror Arrays using Deep Silicon Etching and IR Alignment", C.S.B. Lee et al.

* cited by examiner

METHOD FOR MANUFACTURING MICROELECTROMECHANICAL COMBDRIVE DEVICE

FIELD OF THE INVENTION

This invention relates generally to Micro-Electro Mechanical Systems (MEMS). More particularly, this invention relates to electrostatic combdrive devices and methods for making such devices.

BACKGROUND OF THE INVENTION

Microelectromechanical Systems (MEMS), which are sometimes called micromechanical devices or micromachines, are three-dimensional objects having one or more dimensions ranging from microns to millimeters in size. MEMS have been developed with scanning mirrors, referred to as scanning micromirrors. Such scanning micromirrors can be used in a variety of applications including barcode readers, laser printers, confocal microscopes, and fiber-optic network components such as optical switch arrays. The devices are generally fabricated utilizing semiconductor processing techniques, such as lithographic technologies. Electrostatic combdrive actuators have been developed to actuate such scanning micromirrors. Unfortunately, the combdrive actuator portion of a micromirror device can take up a large portion of chip space. The space taken up by the combdrive actuator can be a limiting factor in the number of micromirror devices that can be placed on a chip. Packing the micromirror devices closer together is desirable, e.g., in optical switch arrays, because it reduces optical path length and allows for smaller mirror design. The current state of the art of combdrive actuators is described, for example, in U.S. patent application Ser. No. 09/584,835 entitled "Staggered Torsional Electrostatic Combdrive and Method of Forming Same" to Robert A. Conant and Jocelyn T. Nee, Kam-Yin Lau and Richard S. Muller, which was filed May 31, 2001.

FIG. 1 illustrates a Staggered Torsional Electrostatic Combdrive (STEC) 20 of the prior art. The STEC 20 includes a stationary combteeth assembly 22 and a moving combteeth assembly 30. The stationary combteeth assembly has individual combteeth 24 formed on a spine 26. The moving combteeth assembly 30 includes individual combteeth 32 linked by a spine 34. The moving combteeth assembly 30 also includes a mirror or paddle 40 with associated torsional hinges 42. In a resting state a moving combteeth assembly 30 is positioned entirely above the stationary combteeth assembly 22 as shown in FIG. 1. A typical prior art process flow involves creating the moving combteeth assembly 30 and the mirror 40 out of the same device layer of a silicon-on-insulator (SOI) wafer.

FIG. 2 illustrates the STEC system 20 in an activated state. This state is achieved by applying a voltage between the moving combteeth assembly 30 and the stationary combteeth assembly 22. In this state, the individual combteeth of the two assemblies interdigitate. The applied voltage attracts the moving combteeth assembly 30 to the fixed combteeth assembly 22, thus exerting torque on the torsional hinges 42, forcing the mirror 40 to tilt. The torsional hinges 42, which are anchored, provide restoring torque when the voltage is removed. Note that the combteeth assemblies 22, 30 take up space that might otherwise be used for additional mirrors. This restricts the density to which devices such as the STEC 20 can be packed. The packing density might be improved somewhat by forming the combteeth 32 at the edges of the mirror 40, but the combteeth 32 would still take up space and restrict the packing density of the mirrors.

Thus, there is a need in the art, for a combdrive device that can be densely packed and a method for fabricating it.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Figure 1:
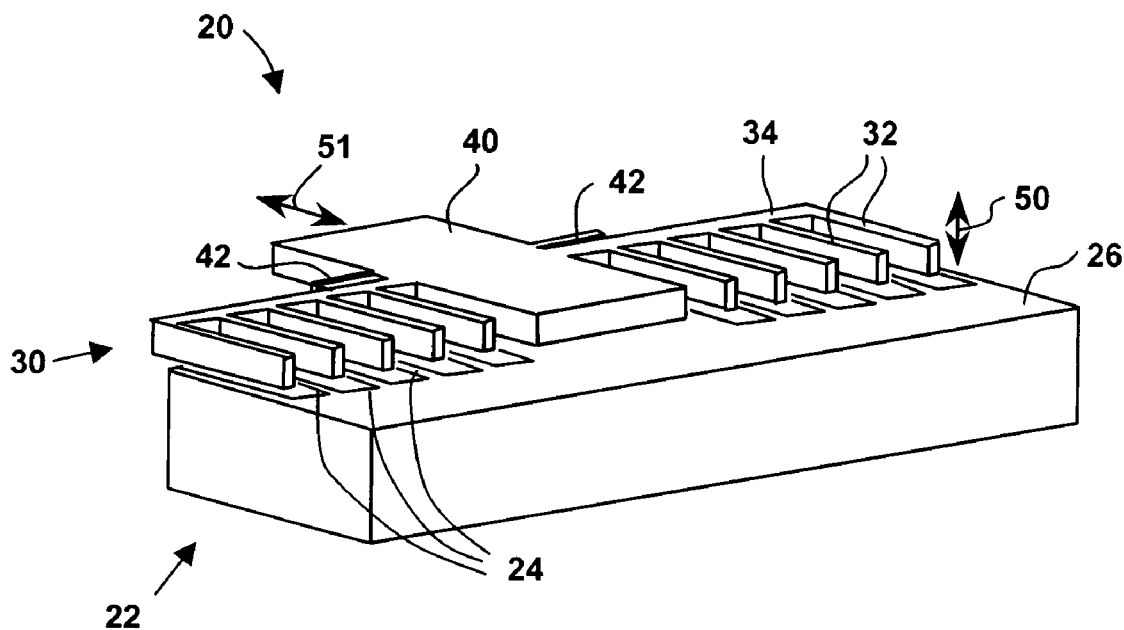
FIGS. 1–2 are isometric diagrams of a Staggered Torsional Electrostatic Combdrive (STEC) according to the prior art.
Figure 2:
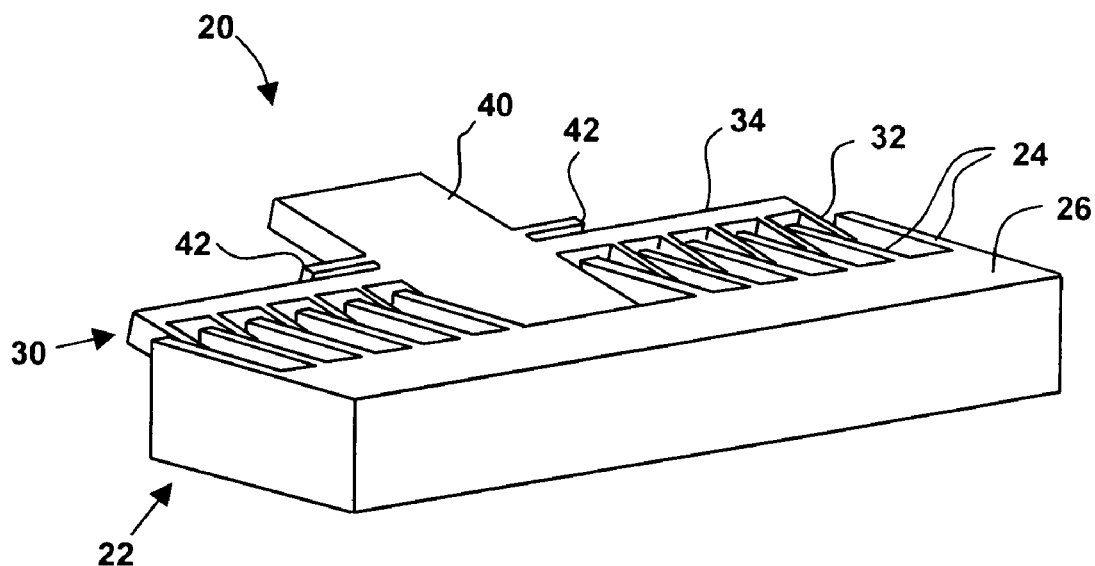
Figure 3A:
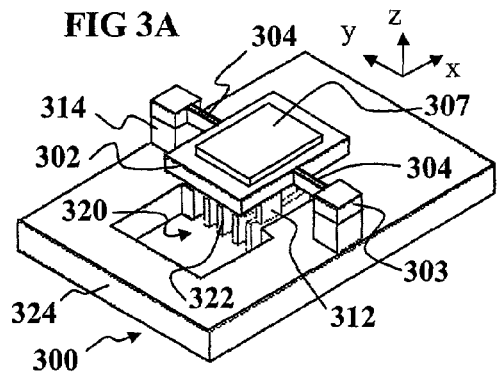
FIGS. 3A–3D depict different views of a combdrive device according to an embodiment of the invention.
Figure 3B:
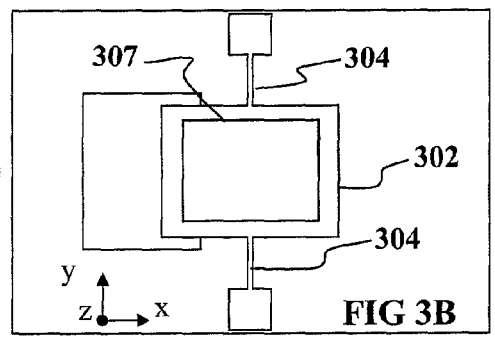
Figure 3C:
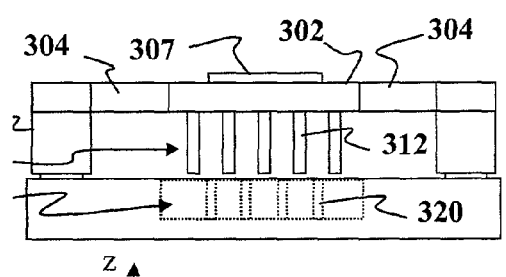
Figure 3D:
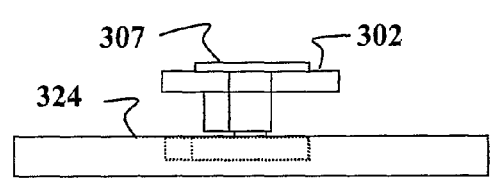

Although the following detailed description contains many specific details for the purposes of illustration, anyone of ordinary skill in the art will appreciate that many variations and alterations to the following details are within the scope of the invention. Accordingly, the embodiments of the invention described below are set forth without any loss of generality to, and without imposing limitations upon, the claimed invention. In the drawings, like numbers refer to like elements throughout.

FIGS. 3A–3D depict different views of a microelectromechanical combdrive device 300 according to an embodiment of the present invention. The device 300 generally includes a movable element 302 having a set 310 of one or more comb teeth 312 that extend from a major surface of the moveable element 302. As used herein, the term "major surface" generally refers to an exposed surface having a relatively large surface area compared to other surfaces of the moveable element 302. Depending on the shape of the moveable element 302, there may be more than one major surface. By way of example, in the case of the substantially rectangular moveable element shown in FIGS. 3A–3D, the top and bottom surfaces of the rectangle would be regarded as major surfaces. In the example shown in FIGS. 3A–3D, the comb teeth 312 extend from the bottom surface of the moveable element 302. The moveable element 302 may include a light-deflecting portion 307. The light deflecting portion 307 may include may include a mirror, such as a simple plane reflecting (or partially reflecting) surface, or a curved reflecting (or partially reflecting) surface. Alternatively, the light-deflecting portion 307 may include one or more prismatic reflectors, refractive elements, prisms, lenses, diffractive elements, e.g., fresnel lenses, a dichroic coated surfaces for wavelength specific and bandpass selectivity, or some combination of these.

The moveable element 302 may be formed from a first device layer 303 of a multi-layered substrate such as a silicon-on-insulator (SOI) wafer. The moveable element 302 may be moveably connected to a portion of the first device layer 303 by a flexure 304. The flexure 304 may be a torsional flexure with a suitable cross-section including a rectangular, I-shaped, or T-shaped cross-section, a cantilever-like flexure, serpentine flexure, a pin-and-staple type hinge, or any flexure, as one skilled in the art is capable of applying, to achieve the desired degree of movement to the moveable element 302. Such movement may include rotational motion about an axis of rotation, translation with respect to one or more axes or some combination of these. By way example, in the device 300 depicted in FIGS. 3A–3D, the flexure 304 defines an axis of rotation about which the moveable element may rotate. The flexure may be offset with respect to the comb teeth 312 to provide the desired range of movement.

The microelectromechanical combdrive device 300 may be constructed in three layers with the moveable element 302 and flexure 304 formed from the first device layer 303. The first set 310 of comb teeth 312 formed from a second device layer 314; and the second set 320 of comb teeth 322 formed from the third device layer 324. A voltage applied between the first and second sets of comb teeth produces an electrostatic force that attracts the comb teeth 312 in the first set 310 towards the comb teeth 322 in the second set. The flexures 304 may impart a biasing torque to the moveable element 302 that tends to counteract this attraction. One or more comb teeth 322 in the second set 320 may be configured to interdigitate with one or more comb teeth 312 in the first set 310. As used herein, "configured to interdigitate" means that in some position within the range of relative motion between the first and second sets of comb teeth a portion of one or more comb teeth in one set is disposed in a space between two adjacent teeth in the other set.

Figure 4A:
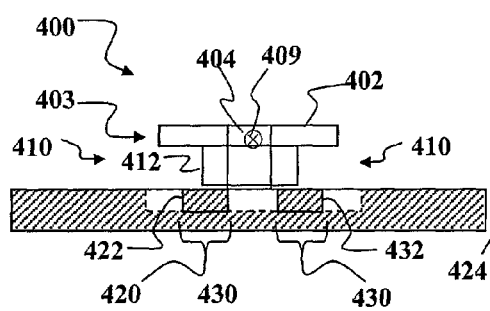
FIGS. 4A–4B depict side elevation views of alternative combdrive devices according to an embodiment of the invention.
Figure 4B:
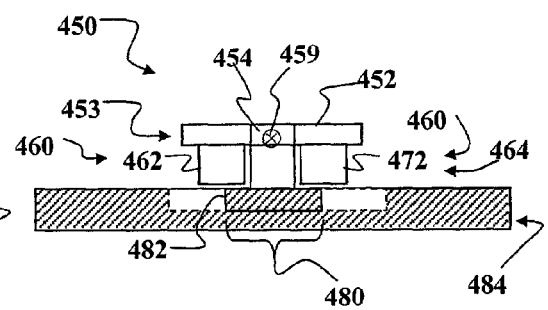

Many variations of the device 300 are possible. Two of many possible variations on the device of FIGS. 3A–3D are shown in FIGS. 4A–4B. In both of these variations, isolated sets of comb teeth may be disposed on either side of an axis of rotation of a movable element. FIGS. 4A–4B respectively depict side elevation schematic views of microelectromechanical combdrive devices 400, 450 according to alternative embodiments of the present invention. The devices 400, 450 respectively include movable elements 402, 452 each having a first set 410, 460 of one or more comb teeth 412, 462 that extend from major surfaces of the moveable elements 402, 452. The microelectromechanical combdrive devices 400, 450 may be constructed in three layers with the moveable elements 402, 452 and flexures 404, 454 formed from first device layers 403, 453. The first sets 410, 460 of comb teeth 412, 462 may be formed from second device layers 414, 464.

The device 400 of FIG. 4A has a second set 420 of comb teeth 422 and a third set 430 of comb teeth 432 that may be positioned on opposite sides of an axis of rotation 409 of the moveable element 402. The second and third sets of comb teeth may be formed from a third device layer 424. One or more comb teeth 412 in the first set 410 may be configured to interdigitate with one or more comb teeth in the second and/or third sets. The second set 420 of comb teeth 422 and the third set 430 of comb teeth 432 are electrically isolated from each other and may be selectively isolated from the first set 410 of comb teeth 412. This configuration allows push-pull electrostatic forces on the moveable element 402 due to the resulting creation of three electrical nodes respectively at the first, second and third sets of comb teeth.

The device 450 of FIG. 4B has a second set 470 of comb teeth 472 that extend from the major surface of the moveable element 452. The first and second sets of comb teeth may be positioned on opposite sides of an axis of rotation 459 of the moveable element 452. The comb teeth 472 in the second set 470 may be formed from the second device layer 464. The device 450 also includes a third set 480 of comb teeth 482 formed from third device layer 484. One or more comb teeth in the first and/or second sets may be configured to interdigitate with one or more comb teeth 482 in the third set 480. The first set 460 of comb teeth 462 and the second set 470 of comb teeth 472 are electrically isolated from each other and may be selectively isolated from the third set 480 of comb teeth 482. This configuration also allows push-pull electrostatic forces of the device due to the resulting creation of three electrical nodes respectively at the first, second and third sets of comb teeth.

Microelectromechanical electrostatic combdrive devices of the types depicted above with respect to FIGS. 3A–3D and 4A–4B may be made by an inventive method. Embodiments of the method generally involve forming a moveable element and forming a first set of comb teeth with one or more comb teeth in the first set extending from a major surface of the first set. In some embodiments of the method, the device is made using three device layers. The moveable element is formed from a first device layer. A first set of comb teeth is formed from a second device layer that is attached to the first. A second set of comb teeth may be formed from a third device layer that is attached to the second.

Figure 5A:
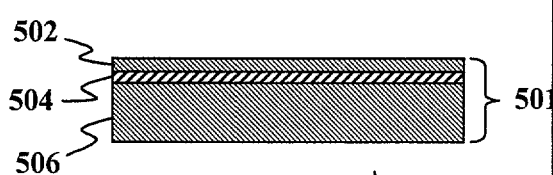
FIGS. 5A–5L depict cross-sectional schematic diagrams illustrating the fabrication of a combdrive device according to an embodiment of the present invention.

An example of an embodiment of the inventive method is depicted in FIGS. 5A–5L, which depict a sequence of cross-sectional diagrams that illustrate various stages of the manufacture of a microelectromechanical combdrive device 500. FIG. 5A shows an example of a starting material 501 from which a moveable element may be made. The starting material 501 includes a first device layer 502, an insulating layer 504 and a handle substrate 506. By way of example and without loss of generality, the starting substrate may be a silicon-on-insulator (SOI) wafer. In the case of such an SOI wafer, the insulating layer 504 may be an oxide, such as silicon oxide, a nitride or other sacrificial material disposed between a device layer 502 and handle substrate 506 made of silicon or other suitable material.

Figure 5B:
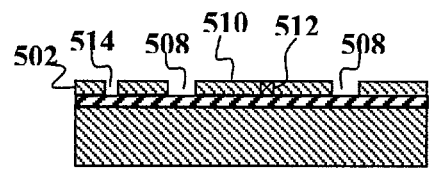

A moveable element 510 is formed from the first device layer 502 as shown in FIG. 5B. By way of example, one or more trenches 508 may be formed in the device layer, e.g., using a lithography and etch technique to define the moveable element 510. The moveable element may include a light-deflecting portion as described above. The trenches 508 are typically formed all the way through the first device layer 502 to the insulating layer 504. The same, or similar techniques may also be used to define one or more flexures 512 that connect the moveable element to other portions of the first device layer 502. One or more alignment targets 514 may optionally be formed in the first device layer 502. The alignment targets 514 have a known position and/or orientation with respect to the moveable element 510. The alignment targets facilitate alignment of features formed in the first device layer 502 to features formed in one or more subsequent layers as described below.

Figure 5C:
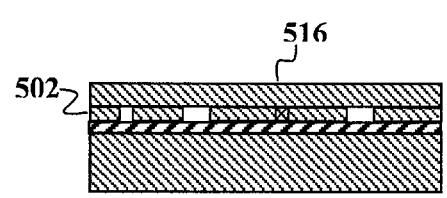
Figure 5D:
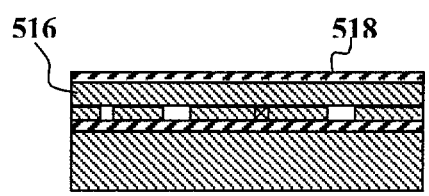

A second device layer 516 may be directly attached to the first device layer 502 as shown in FIG. 5C. By way of example second device layer 516 may be made from the same material as the first device layer 502 although this need not be the case. The first and second device layers may be attached by any suitable method such as plasma bonding, or silicon fusion bonding. One or more sets of comb teeth may be formed from the second device layer 516. An example of one of many possible ways for forming the comb teeth is shown and described with respect to FIGS. 5D–5F. Specifically, an insulating layer 518 may be formed on an exposed major surface of the second device layer 516 as shown in FIG. 5D. The insulating layer 518 may be formed, e.g., by oxidizing a portion of the exposed surface of the second device layer 516 to form an oxide layer.

Figure 5E:
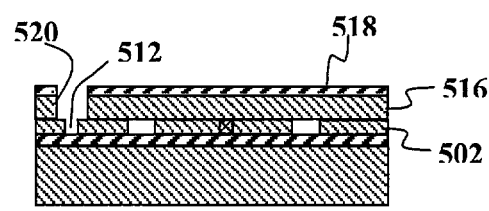
Figure 5F:
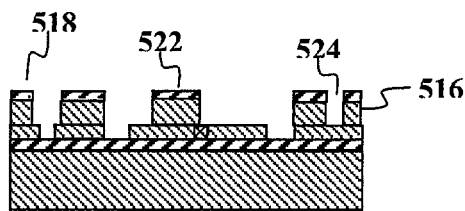

One or more alignment holes 520 may be formed through the second insulating layer 518 and the second device layer 516 to expose the alignment targets 514 in the first device layer 502 as shown in FIG. 5E. The alignment holes 520 roughly align with the alignment targets 514. The alignment holes 520 may be made larger than the alignment targets 514. With the alignment targets 514 exposed, it is possible to accurately align subsequent lithography and etch operations with respect to features in the first device layer 502, such as the moveable element 510, that are hidden by the second device layer 516. Using the exposed alignment targets 514 as a guide, a first set of comb teeth 522 may be formed from the second device layer 516 as shown in FIG. 5F. By way of example, the first set of comb teeth 522 may be formed by a deep reactive ion etch (DRIE) process. One or more alignment targets may also be formed through the second insulating layer 518 and second device layer 516 to facilitate alignment of features formed in subsequent layers.

In an alternative embodiment, two or more sets of comb teeth may be formed in the second device layer to provide a configuration such as that shown in FIG. 4B. An insulating layer may be disposed between the first and second device layers to facilitate electrical isolation of the two sets of comb teeth.

Figure 5G:
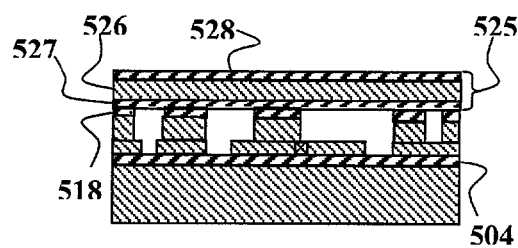

A third device layer 526 may be attached to the second device layer 516 as shown in FIG. 5G to facilitate formation of a third set of comb teeth. By way of example, and without loss of generality, the third device layer 526 may be part of a wafer 525 having the third device layer 526 disposed between third and fourth insulating layers 527, 528, e.g., a silicon layer disposed between two silicon oxide layers. The third device layer 526 may be attached to the second insulating layer 516, e.g., by bonding the third insulating layer 527 to one or more remaining portions of the second insulating layer 518.

Figure 5H:
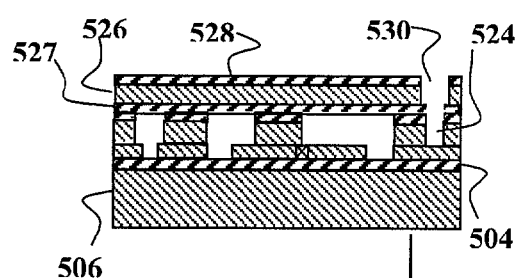
Figure 5I:
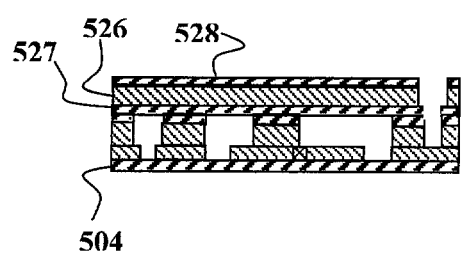
Figure 5J:
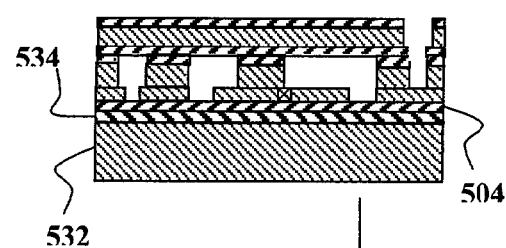

An example of one of many possible ways for forming the second set of comb teeth from the third device layer is shown and described with respect to FIGS. 5H–5K. As shown in FIG. 5H, one or more alignment holes 530 may be formed through the fourth insulating layer 528, third device layer 526 and third insulating layer 527 to expose the alignment targets 524 in the second device layer 516. The alignment holes 530 may penetrate the insulating layer 527 to expose the alignment targets 524. Subsequent processing operations may be aligned, e.g., with respect to first set of comb teeth 522 using the alignment targets 524. In an optional operation, the handle substrate may be removed, e.g. by separating it from the first insulating layer 504 as shown in FIG. 5I. A new handle substrate 532 may be attached to the first insulating layer 504, as shown in FIG. 5J, e.g., using a photoresist layer 534 disposed between the new handle substrate 532 and the first insulating layer 504. The optional operations depicted in FIGS. 5I–5J facilitate the release of the moveable element 510 as described below.

Figure 5K:
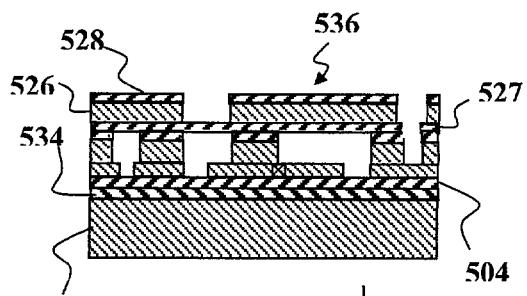
Figure 5L:
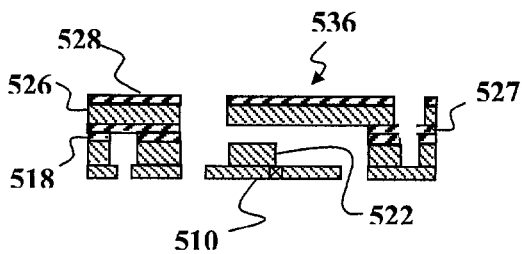

Using the exposed alignment targets 524 as a guide, a second set of one or more comb teeth 536 may be formed from the third device layer 516 as shown in FIG. 5K. By way of example, the second set of comb teeth 536 may be formed by a DRIE process. By suitable offset of the second set of comb teeth 536 with respect to the first set of comb teeth 522 it is possible to configure one or more comb teeth in the first set to interdigitate with one or more comb teeth in the second set. To complete the device 500 the moveable element 510 may now be released, e.g., by removing the new handle substrate 532, photoresist layer 534, first insulating layer 504 and selected portions of the second and third insulating layers 518, 527 as shown in FIG. 5L. In a particular embodiment of the method, the release may be accomplished by removing the photoresist layer with a photoresist stripper and then a timed release of the comb teeth using hydrofluoric acid (HF).

Embodiments of the present invention thus provide the major benefit reduction of the footprint of microelectromechanical electrostatic combdrive devices such as micromirror devices. As described above, the footprint of a micromirror device can be reduced by extending one or more sets of comb teeth from a major surface of a moveable element in such a device. This allows for better system-level design in optical switches and provides the ability to pack the devices closer together. In the particular case of an optical switch, the ability to pack the micromirror devices closer facilitates the design and fabrication of higher density optical switches with increased port count while managing beam path lengths.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for making a microelectromechanical combdrive device, comprising:
    forming a moveable element from a first device layer;
    attaching a second device layer to the first device layer
    forming a first set of comb teeth from the second device layer, wherein one or more comb teeth in the first set extend from a major surface of the moveable element;
    attaching a third device layer to the second device layer; and
    forming a second set of comb teeth from the third device layer,
    wherein the first set of comb teeth are aligned to the moveable element by:
    before attaching the second device layer to the first device layer, forming an alignment target in the first device layer, and
    after attaching the second device layer to the first device layer and before forming the first set of comb teeth, forming an alignment hole in the second device layer, wherein the alignment hole is roughly aligned to the alignment target.

2. The method of claim 1 wherein one or more comb teeth in the second set are configured to interdigitate with one or more comb teeth in the first set.

3. The method of claim 1 wherein the first device layer is part of a wafer that includes a handle substrate.

4. The method of claim 3, further comprising removing the handle substrate after attaching the third device layer to the second device layer.

5. The method of claim 3 wherein the handle substrate and first device layer are part of a silicon-on-insulator wafer.

6. The method of claim 5 wherein the silicon on insulator wafer includes an insulating layer disposed between the first device layer and the handle substrate.

7. The method of claim 5 wherein the silicon on insulator wafer includes an insulating layer disposed between the first device layer and the handle substrate.

8. The method of claim 1 wherein the moveable element includes a light deflecting portion.

9. The method of claim 8 wherein the light deflecting portion includes a mirror.

10. A method for making a microelectromechanical combdrive device, comprising:
forming a moveable element from a first device layer;
attaching a second device layer to the first device layer
forming a first set of comb teeth from the second device layer, wherein one or more comb teeth in the first set extend from a major surface of the moveable element;
attaching a third device layer to the second device layer; and
forming a second set of comb teeth from the third device layer,
wherein the second set of comb teeth are aligned to the first set of comb teeth by:
before attaching the third device layer to the second device layer, forming an alignment target in the second device layer, and
after attaching the third device layer to the second device layer and before forming the second set of comb teeth, forming an alignment hole in the third device layer, wherein the alignment hole is roughly aligned to the alignment target.

11. The method of claim 10 wherein one or more comb teeth in the second set are configured to interdigitate with one or more comb teeth in the first set.

12. The method of claim 10 wherein the first device layer is part of a wafer that includes a handle substrate.

13. The method of claim 12, further comprising removing the handle substrate after attaching the third device layer to the second device layer.

14. The method of claim 12 wherein the handle substrate and first device layer are part of a silicon-on-insulator wafer.

15. The method of claim 10 wherein the moveable element includes a light deflecting portion.

16. The method of claim 15 wherein the light deflecting portion includes a mirror.

17. A method for making a microelectromechanical combdrive device, comprising:
forming a moveable element and a flexure from a first device layer of a wafer having a first insulating layer disposed between the first device layer and a handle substrate;
forming an alignment target in the first device layer;
after forming the alignment target in the first device layer, attaching a second device layer to the first device layer such that the first device layer is disposed between the insulating layer and the second device layer;
forming a second insulating layer on a surface of the second device layer such that the second device layer is disposed between the oxide layer and the first device layer;
forming one or more comb teeth from the second device layer, wherein the one or more comb teeth extend from a major surface of the moveable element;
before attaching a third device layer to the second insulating layer, forming an alignment hole through the second insulating layer and the second device layer, wherein the alignment hole roughly aligns with the alignment target;
attaching the third device layer to the second insulating layer such that the second insulating layer is disposed between the second and third device layers;
forming one or more comb teeth from the third device layer, wherein the one or more comb teeth formed from the third device layer are configured to interdigitate with one or more of the comb teeth formed from the second device layer; and
releasing the movable element.

18. The method of claim 17, further comprising, before forming the comb teeth in the third device layer, removing the handle substrate and attaching a new handle substrate to the first insulating layer.

19. The method of claim 18 wherein the new handle substrate is attached to the first insulating layer with a photoresist.

20. The method of claim 18 wherein releasing the moveable element includes releasing the new handle substrate with a photoresist stripper.

21. The method of claim 17 wherein releasing the moveable element includes removal of selected portions of the first and second insulating layers.

22. A method for making a microelectromechanical combdrive device, comprising:
forming a moveable element and a flexure from a first device layer of a wafer having a first insulating layer disposed between the first device layer and a handle substrate;
attaching a second device layer to the first device layer such that the first device layer is disposed between the insulating layer and the second device layer;
forming a second insulating layer on a surface of the second device layer such that the second device layer is disposed between the oxide layer and the first device layer;
forming one or more comb teeth from the second device layer, wherein the one or more comb teeth extend from a major surface of the moveable element;
before attaching a third device layer to the second insulating layer, forming an alignment target in the second device layer;
attaching the third device layer to the second insulating layer such that the second insulating layer is disposed between the second and third device layers;
before forming one or more comb teeth from the third device layer, forming an alignment hole through the third insulating layer, wherein the alignment hole roughly aligns with the alignment target;
forming one or more comb teeth from the third device layer, wherein the one or more comb teeth formed from the third device layer are configured to interdigitate with one or more of the comb teeth formed from the second device layer; and
releasing the movable element.

23. The method of claim 22, further comprising, before forming the comb teeth in the third device layer, removing the handle substrate and attaching a new handle substrate to the first insulating layer.

24. The method of claim 23 wherein the new handle substrate is attached to the first insulating layer with a photoresist.

25. The method of claim 23 wherein releasing the moveable element includes releasing the new handle substrate with a photoresist stripper.

26. The method of claim 22 wherein releasing the moveable element includes removal of selected portions of the first and second insulating layers.

* * * * *